(12) United States Patent
Standaert et al.

(10) Patent No.: US 7,645,700 B2
(45) Date of Patent: Jan. 12, 2010

(54) DRY ETCHBACK OF INTERCONNECT CONTACTS

(75) Inventors: Theodorus E Standaert, Pine Bush, NY (US); William H Brearley, Poughkeepsie, NY (US); Stephen E Greco, Lagrangeville, NY (US); Sujatha Sankaran, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 11/946,922

(22) Filed: Nov. 29, 2007

(65) Prior Publication Data

US 2008/0088027 A1    Apr. 17, 2008

Related U.S. Application Data

(62) Division of application No. 11/161,538, filed on Aug. 8, 2005, now Pat. No. 7,323,410.

(51) Int. Cl.
  *H01L 21/44* (2006.01)
(52) U.S. Cl. .............. 438/672; 438/637; 438/639; 438/700; 257/E21.059
(58) Field of Classification Search ............ 438/672, 438/637, 639, 700; 257/E21.597
  See application file for complete search history.

(56) References Cited

U.S. PATENT DOCUMENTS

| | | | |
|---|---|---|---|
| 4,808,552 A | 2/1989 | Anderson | |
| 5,244,534 A * | 9/1993 | Yu et al. | 438/672 |
| 5,413,670 A * | 5/1995 | Langan et al. | 134/1.2 |
| 5,786,272 A | 7/1998 | Marangon et al. | |
| 5,970,374 A | 10/1999 | Teo | |
| 6,043,163 A * | 3/2000 | Tsai et al. | 438/706 |
| 6,174,804 B1 | 1/2001 | Hsu | |
| 6,239,025 B1 * | 5/2001 | Bease et al. | 438/637 |
| 6,426,558 B1 | 7/2002 | Chapple-Sokol et al. | |
| 6,534,389 B1 | 3/2003 | Ference et al. | |
| 6,566,242 B1 * | 5/2003 | Adams et al. | 438/622 |
| 6,753,249 B1 | 6/2004 | Chen et al. | |
| 6,867,073 B1 * | 3/2005 | Enquist | 438/125 |
| 2003/0127708 A1 | 7/2003 | Liu et al. | |
| 2004/0106297 A1 | 6/2004 | Kanegae et al. | |

FOREIGN PATENT DOCUMENTS

| EP | 0 966 037 A2 | 12/1999 |
|---|---|---|
| EP | 0966037 A3 | 8/2000 |

* cited by examiner

*Primary Examiner*—David A Zameke
*Assistant Examiner*—Jenny L Wagner
(74) *Attorney, Agent, or Firm*—Joseph Petrokaitis

(57) ABSTRACT

A method and structure for a composite stud contact interface with a decreased contact resistance and improved reliability. A selective dry etch is used which comprises a fluorine containing gas. The contact resistance is reduced by partially dry-etching back the tungsten contact after or during the M1 RIE process. The recessed contact is then subsequently metalized during the M1 liner/plating process. The tungsten contact height is reduced after it has been fully formed.

22 Claims, 5 Drawing Sheets

DRY ETCHBACK OF INTERCONNECT CONTACTS

CROSS TO RELATED APPLICATION

This application is a divisional application of U.S. Ser. No. 11/161,538 filed Aug. 8, 2005, the disclosures of which are incorporated by reference herein in their entirety.

BACKGROUND OF THE INVENTION

The present invention is directed to the manufacture of semiconductor devices and particularly to the manufacture of metallurgy for integrated circuit devices.

This invention relates to the formation of metallurgical interconnects for semiconductor devices, and particularly to the formation of contacts formed at the semiconductor surface which interface with metallurgy formed of copper-based metals. In the currently practiced process local interconnect trenches are etched into a first insulating layer deposited on top of a substrate having active devices. The etched trenches are filled with a liner/tungsten core to make contact with some portions of the substrate devices and polished to be coplanar with the first insulating layer to form the local interconnect (MC).

A second insulating layer is deposited and stud contact holes etched into it. The etched stud contact holes are filled with a liner/tungsten core and polished to be coplanar with a second insulating layer forming the stud contacts (CA) imbedded in the insulating layer which make contact with the local interconnect (MC) and also with additional portions of the devices. The first wiring level (M1) is then formed by either a deposition and subtractive etch or by a damascene process requiring a third layer. This M1 wiring level makes contact with the stud contacts (CA). While a preferred embodiment of the present invention is described using a tungsten local interconnect, the invention is not limited to use with this particular structure.

CA (stud contact) contact resistance is increasing as the technology moves from the 90 nm node to the 65 and 45 nm node. The present invention is directed to reducing this contact resistance. Another purpose of the present invention is to provide a more reliable contact.

These and other purposes of the present invention will become more apparent after referring to the following description considered in conjunction with the accompanying drawings.

BRIEF SUMMARY OF THE INVENTION

This invention provides a method of making an electronic device comprising the steps of providing a substrate on which contacts are to be formed; providing a conductive via comprised of a first conductive material formed in an oxide on the substrate; providing a dielectric layer on the conductive via; providing an oxide layer on the dielectric layer; providing a photoresist layer on the oxide layer; forming openings in the photoresist layer; removing the photoresist layer and removing in the openings the dielectric layer and the oxide layer and at least a portion of the first conductive material with a fluorine containing gas; and depositing a second conductive material in the openings to form a composite conductive via comprising the first conductive material and the second conductive material.

The fluorine containing gas is preferably $NF_3$, $F_2$ or $SF_6$. In a preferred embodiment the dielectric layer is a low-K SiCOH material. The low-K SiCOH material may be a porous ultra low-K material. In a preferred embodiment the first conductive material in Tungsten and the second conductive material is Copper. In a preferred embodiment the fluorine containing gas comprises approximately 500 sccm of Argon and approximately 50 sccm of $NF_3$. The fluorine containing gas may further comprise approximately 10 sccm $O_2$ and 50 sccm of $CH_2F_2$ or $CH_3F$ at a pressure of approximately 100 mTorr to approximately 200 mTorr.

The invention further provides a method of making an electronic device comprising the steps of: providing a substrate on which contacts are to be formed; providing a conductive via comprised of a first conductive material formed in an oxide on the substrate; providing a dielectric layer on the conductive via; providing an oxide layer on the dielectric layer; providing a photoresist layer on the oxide layer; forming openings in the photoresist layer; removing in the openings the dielectric layer and the oxide layer with a fluorocarbon containing gas; removing the photoresist layer; removing at least a portion of the first conductive material in the openings with a fluorine containing gas; depositing a second conductive material in the openings to form a composite conductive via comprising the first conductive material and the second conductive material.

The invention further provides a method of making an electronic device comprising the steps of: providing a substrate on which contacts are to be formed; providing a conductive via comprised of a first conductive material formed in an oxide on the substrate; providing a dielectric layer on the conductive via; providing an oxide layer on the dielectric layer; providing a photoresist layer on the oxide layer; forming openings in the photoresist layer; removing in the openings the dielectric layer and the oxide layer with a fluorocarbon containing gas; removing the photoresist layer and removing in the openings a portion of the first conductive material with a fluorine containing gas; depositing a second conductive material in the openings to form a composite conductive via comprising the first conductive material and the second conductive material.

The invention further provides an electronic device, comprising: a poly-silicon gate formed on a substrate; a composite stud via structure in contact with the poly-silicon gate, the composite stud via structure having a first portion and a second portion. In a preferred embodiment the first portion is comprised of Tungsten and the second portion is comprised of Copper. In a preferred embodiment only the first portion is in contact with the poly-silicon gate. In a preferred embodiment the composite stud via structure is approximately 100 nanometers in width and approximately 2,000 angstroms in height.

The first portion is approximately 500 angstroms in height.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

The present invention reduces the CA contact resistance by partially dry-etching back the tungsten CA contact after or during the M1 RIE process. The recessed CA contact is then subsequently metalized during the M1 liner/plating process. The present invention reduces the tungsten CA height after it has been fully formed. Reducing the CA height will have a significant impact on the CA contact resistance.

For example, consider M1 in a SiCOH material with a TEOS (Tetraethyl Orthosilicate, $Si(OC_2H_5)_4$) hard mask (HM). There is a selective SiCOH etch chemistry which does not (or at a much lower rate) etch TEOS (both HM and CA TEOS). This SiCOH etch chemistry is NF3 based which is expected to readily etch W.

The present invention discloses the etchback in the dielectric etch of M1 in order to lower the resistance of the tungsten contact. The recess of the tungsten is not a problem for subsequent metallization since the invention uses conventional liner/seed/plating processes that can reliably fill high aspect ratio features.

Figure 1:
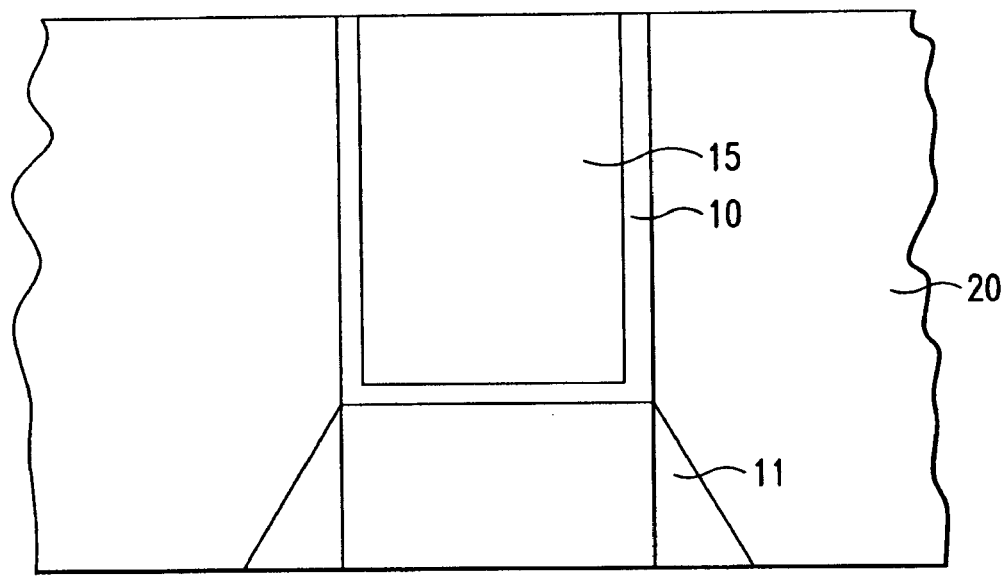
FIGS. 1-5 illustrate a conventional process for forming a stud contact interconnect.
Figure 2:
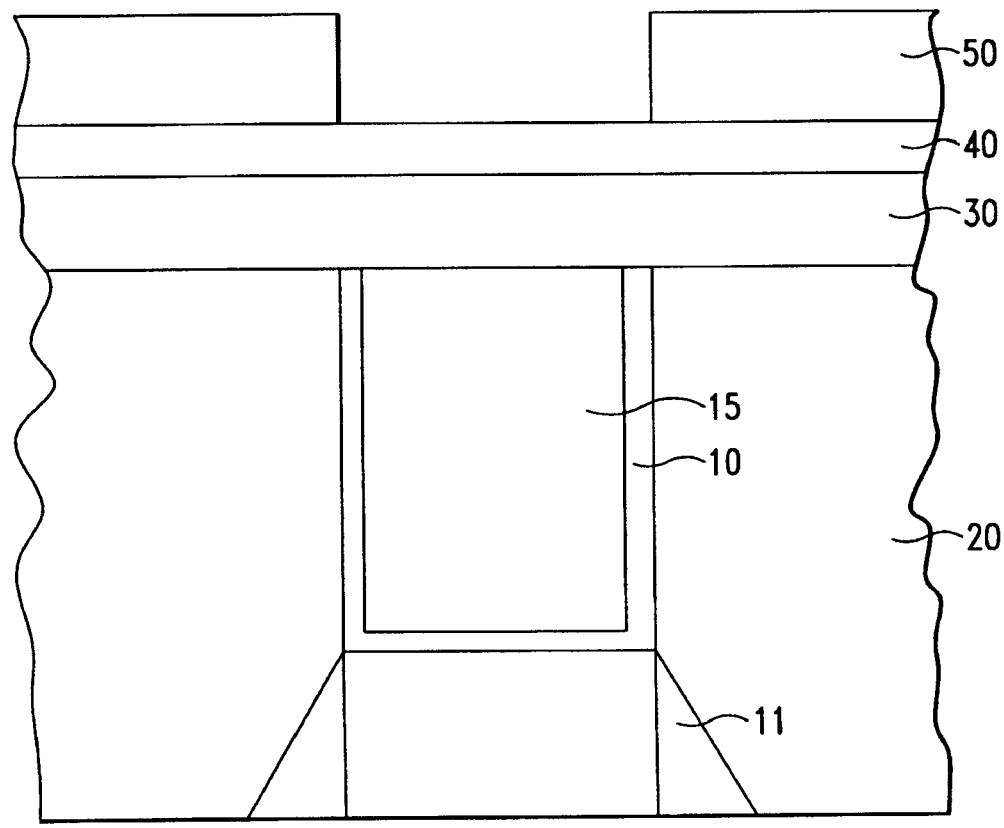

Referring to the Figures in more detail, and particularly referring to FIG. 1, there is shown a conductive via (CA) 15 in an oxide 20. In a preferred embodiment the conductive material will be Tungsten (W). Referring now to FIG. 2, the next level metal wires can now be created by a conventional damascene process which starts out with the deposition of a low-k dielectric film (M1 dielectric) 30 followed by the deposition of an oxide hardmask (M1 Hardmask) 40 and M1 photoresist 50.

Figure 3:
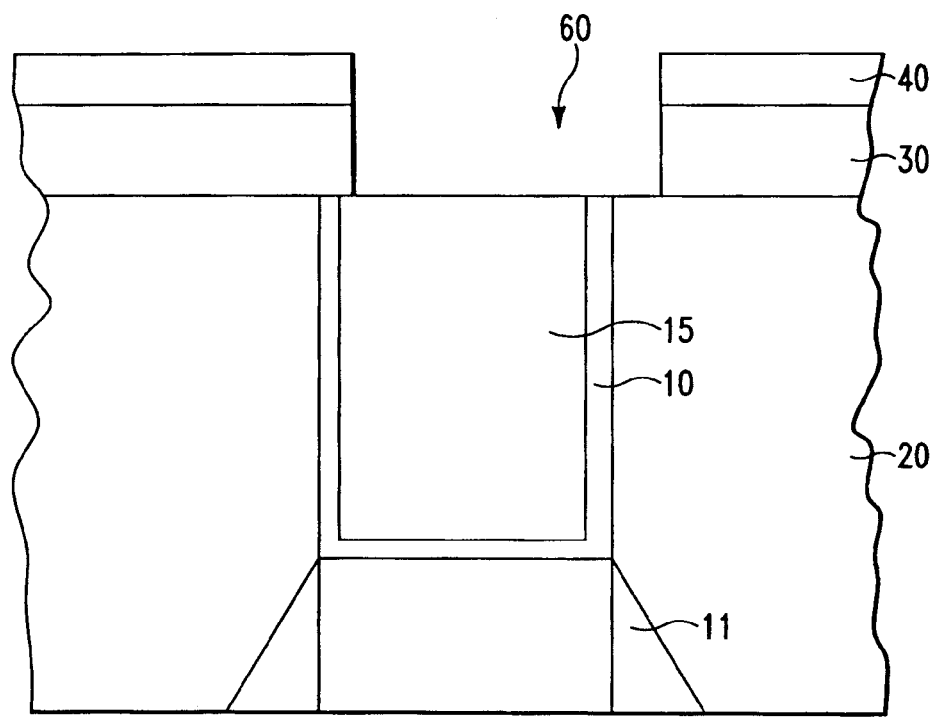
Figure 4:
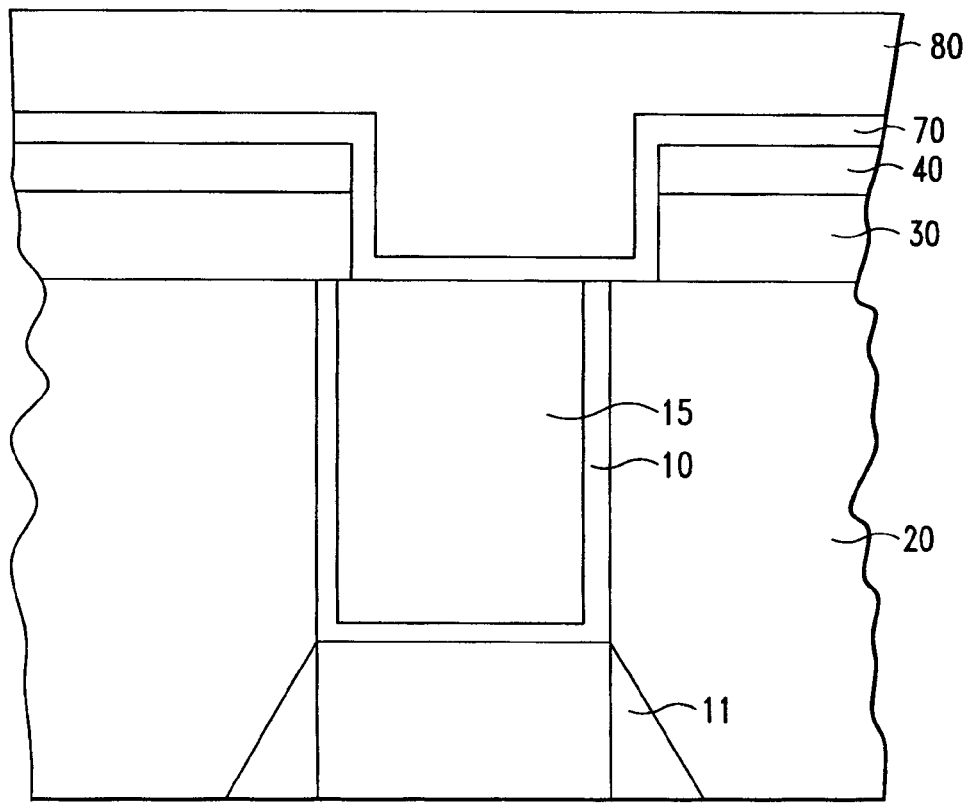
Figure 5:
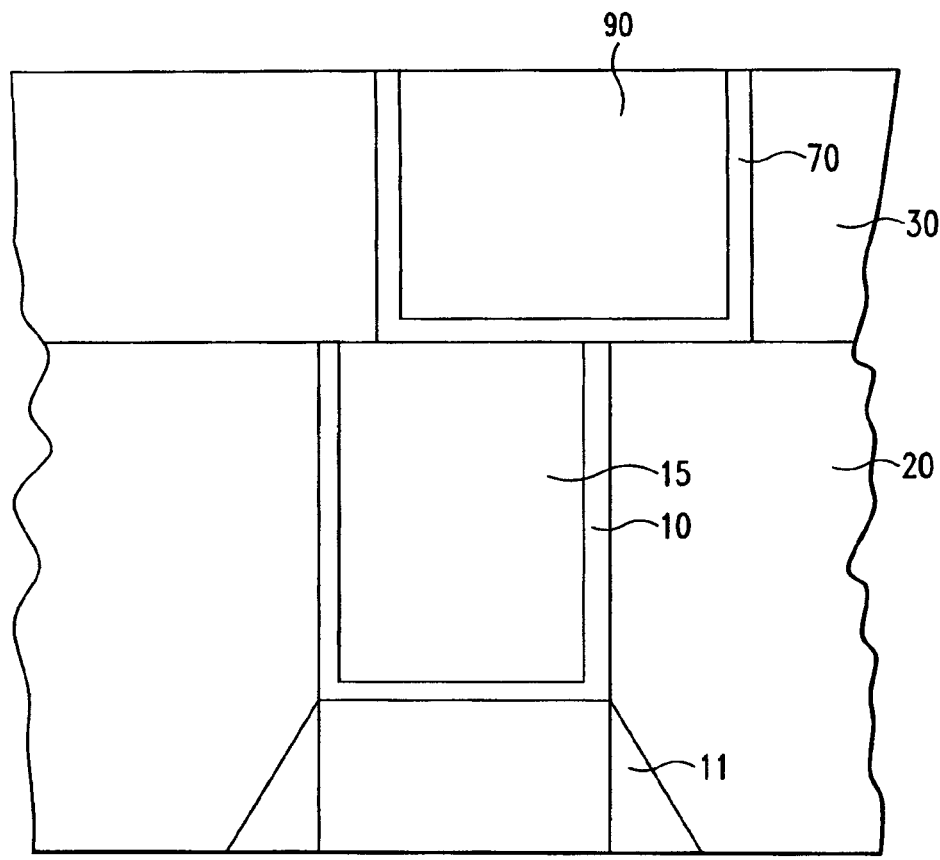

Referring now to FIG. 3 there is shown the transfer of the M1 line pattern 60 into the dielectric 30 by Reactive Ion Etching (RIE) including a resist strip. Referring now to FIG. 4 there is shown the conventional processing step of liner/seed/plating to form liner 70 and M1 wiring metal 80. Referring now to FIG. 5 there is shown the last conventional processing step of CMP to form the M1 wiring 90.

The present invention can be used with the same dielectric deposition steps of the low-k material 30 and oxide hardmask 40, followed by the same lithography step as illustrated in FIG. 2. The present invention deviates from the known art either during or after the RIE step.

Figure 6:
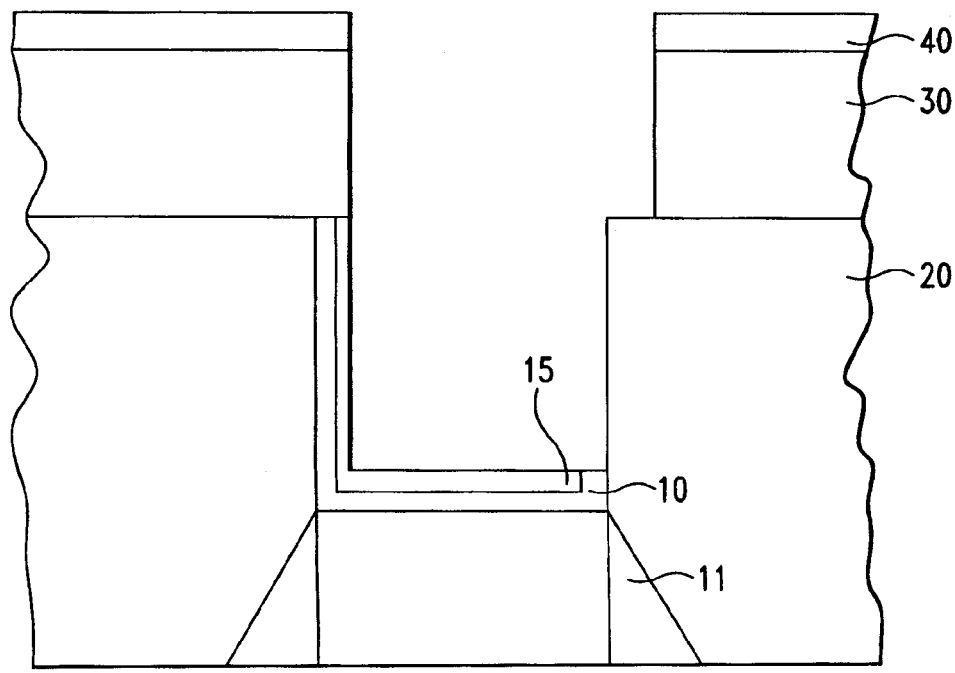
FIGS. 6-9 illustrate a method for forming a stud contact interconnect according to the present invention.

Referring to FIG. 6, a first embodiment of the present invention is to use a fluorine containing gas (but not a fluorocarbon based gas) such as NF3, F2 or SF6 to selectively etch the low-k dielectric 30 to oxide 20. In a preferred embodiment the low-k dielectric 30 is a SiCOH-like material, and could be a porous-ULK material. The resist selectivity during this RIE step will be low and the critical dimension (CD) control in this case is provided by the oxide hardmask 40 which exhibits a low etch rate in these fluorine-based chemistries. Once the low-k material 30 above the CA tungsten 15 clears, the fluorine based chemistry can also etch the CA tungsten 15 as well as the CA liner 10. Therefore, the low-k over etch can be used to recess the CA tungsten via to the desired depth. Since the etch rate of resist is high in these chemistries, it can be completely consumed before or during the low-k over etch and no additional resist strip is required.

This selective M1 RIE process is compatible with conventional etch tools such as parallel plate and medium density plasma RIE tools. In a preferred embodiment the etch gases comprise approximately 500 sccm of Ar and approximately 50 sccm of NF3. In addition, small amounts of $O_2$ and $CH_2F_2$ or $CH_3F$ may be added. For example, approximately 10 sccm of $O_2$ and approximately 50 sccm of $CH_2F_2$ or $CH_3F$. The latter additions can help maintain the critical dimensions or increase the selectivity to the oxide hardmask or resist. In a preferred embodiment the pressure is approximately 100 to 200 mTorr with a power of about 500 W for both 27 and 2 MHz frequencies.

Another embodiment of the present invention is to follow known art after the lithography step. In other words, use a fluorocarbon based chemistry to define the trench and a resist strip to remove the photoresist materials. At this point, one can switch to the fluorine-based chemistry (NF3, F2, SF6) to recess the CA tungsten 15 and liner 10 selectively to the oxide hardmask 20 and CA TEOS.

In another embodiment of the present invention, the known art is followed after the lithography step. In this case, one can use a fluorocarbon based chemistry to define the trench into the low-k dielectric 30 but omit the resist strip. The next step would be to recess the CA tungsten 15 and liner 10 which also strips the remaining photoresist materials 50.

Figure 7:
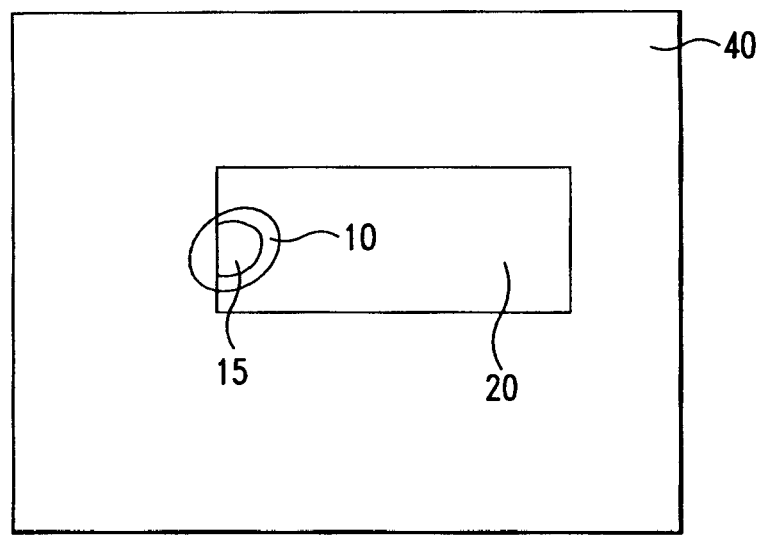

FIG. 6 shows the final results in cross section. FIG. 7 shows a top-down view for these three embodiments illustrating the partially exposed CA tungsten 15 and liner 10 in the recessed trench formed in the low-k dielectric 30 and oxide hardmask 40. The metallization of this structure is achieved by the known art discussed above.

Figure 8:
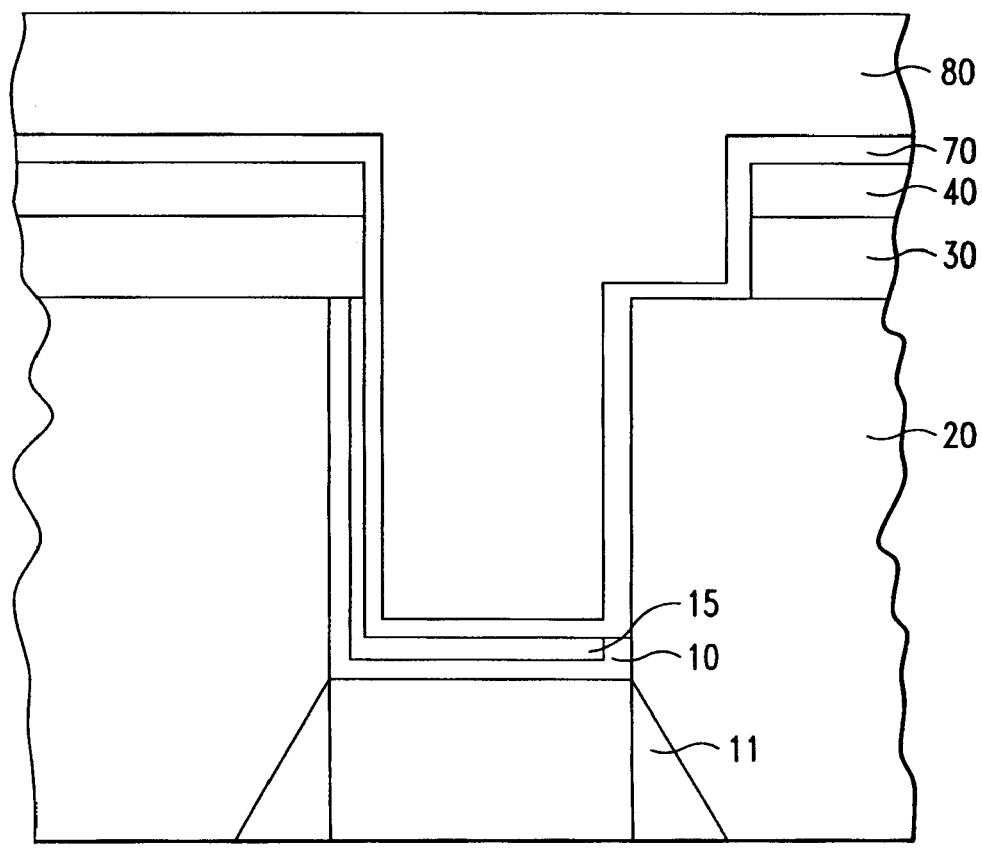
Figure 9:
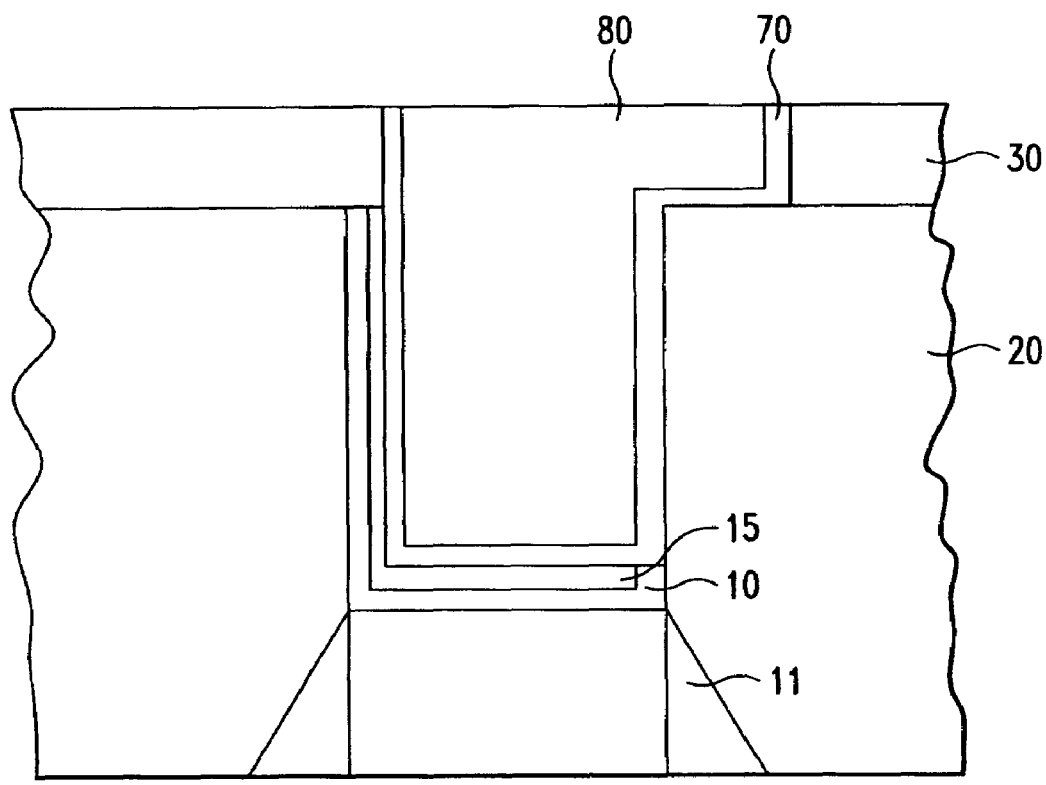

Referring to FIG. 8 the structure is shown following liner/seed/plating of liner 70 and M1 wiring metal 80. Referring to FIG. 9 the structure is shown after CMP.

The novel features of the invention can be appreciated by comparing FIG. 5 and FIG. 9. The CA has been recessed directly below the M1 line and a significant portion of the Tungsten volume 15 in the CA stud has been replaced by Copper 80. The lower resistivity of Copper 80 results in a lower stud resistance. In addition, the contact area between the CA stud 15 and the M1 line 80 is significantly higher with the new structure and will yield a more reliable interface. This offers the significant reliability advantage that the interface to the devices remains unaltered and the material is the same (barrier and W).

As illustrated in FIG. 9 the CA stud interconnect is now a composite structure of two conductive materials. In the preferred embodiment the conductive materials are Tungsten and Copper. In a preferred embodiment the composite stud structure is approximately 100 nanometers in width and approximately 2,000 angstroms in height and the Tungsten portion is approximately 500 angstroms in height.

This composite CA stud contact will have a lower contact resistance than a conventional contact. For example, a 2,000 angstrom high and 95 nm wide conventional Tungsten CA stud has an estimated contact resistance of 19 ohms. Approximately a third of this resistance is from W conductivity. If the Tungsten CA is etch backed to a 500 angstrom height, the contact resistance will drop from 19 to 13 ohms. Another advantage is that the contact area between any misaligned (and recessed) CA stud and the M1 line is increased. Besides a lower contact resistance between the copper line and the CA stud, this also provides a more reliable contact.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of making an electronic device comprising the steps of:

providing a substrate on which contacts are to be formed;
providing a conductive via comprised of a first conductive material formed in an oxide on said substrate;
providing a dielectric layer on said conductive via;
providing an oxide layer on said dielectric layer;
providing a photoresist layer on said oxide layer;
forming openings in said photoresist layer;
removing in said openings said dielectric layer and said oxide layer with a fluorocarbon containing gas;
removing said photoresist layer;
removing a portion of said first conductive material in said openings with a fluorine containing gas;
depositing a second conductive material in said openings to form a composite conductive via comprising said first conductive material and said second conductive material.

2. The method of claim 1 wherein said fluorine containing gas is selected from the group consisting of $NF_3$, $F_2$ and $SF_6$.

3. The method of claim 1 wherein said dielectric layer is a low-K SiCOH material.

4. The method of claim 3 wherein said low-K SiCOH material is a porous ultra low-K material.

5. The method of claim 1 wherein said first conductive material in Tungsten and said second conductive material is Copper.

6. The method of claim 2 wherein said fluorine containing gas removal comprises approximately 500 sccm of Argon and approximately 50 sccm of $NF_3$.

7. The method of claim 6 wherein said fluorine containing gas removal further comprises approximately 10 sccm $O_2$ and 50 sccm of $CH_2F_2$ or $CH_3F$.

8. The method of claim 6 wherein said fluorine containing gas removal pressure is approximately 100 mTorr to approximately 200 mTorr.

9. A method of making an electronic device comprising the steps of:
providing a substrate on which contacts are to be formed;
providing a conductive via comprised of a first conductive material formed in an oxide on said substrate;
providing a dielectric layer on said conductive via;
providing an oxide layer on said dielectric layer;
providing a photoresist layer on said oxide layer;
forming openings in said photoresist layer;
removing in said openings said dielectric layer and said oxide layer with a fluorocarbon containing gas;
removing said photoresist layer and removing in said openings a portion of said first conductive material with a fluorine containing gas;
depositing a second conductive material in said openings to form a composite conductive via comprising said first conductive material and said second conductive material.

10. The method of claim 9 wherein said fluorine containing gas is selected from the group consisting of $NF_3$, $F_2$ and $SF_6$.

11. The method of claim 9 wherein said dielectric layer is a low-K SiCOH material.

12. The method of claim 11 wherein said low-K SiCOH material is a porous ultra low-K material.

13. The method of claim 9 wherein said first conductive material in Tungsten and said second conductive material is Copper.

14. The method of claim 10 wherein said fluorine containing gas removal comprises approximately 500 sccm of Argon and approximately 50 sccm of $NF_3$.

15. The method of claim 14 wherein said fluorine containing gas removal further comprises approximately 10 sccm $O_2$ and 50 sccm of $CH_2F_2$ or $CH_3F$.

16. The method of claim 14 wherein said fluorine containing gas removal pressure is approximately 100 mTorr to approximately 200 mTorr.

17. An electronic device, comprising:
a poly-silicon gate formed on a substrate;
a composite stud via structure in contact with said poly-silicon gate, said composite stud via structure having a first portion and a second portion.

18. The electronic device of claim 17 wherein said first portion is comprised of Tungsten and said second portion is comprised of Copper.

19. The electronic device of claim 18 wherein only said first portion is in contact with said poly-silicon gate.

20. The electronic device of claim 19 wherein said composite stud via structure is approximately 100 nanometers in width and approximately 2,000 angstroms in height.

21. The electronic device of claim 19 wherein said first portion is approximately 500 angstroms in height.

22. The electronic device of claim 18 wherein said first portion is in contact with said poly-silicon gate and a conductive metal interconnect.

* * * * *